(12) United States Patent
Wong (10) Patent No.: US 6,693,480 B1
(45) Date of Patent: Feb. 17, 2004

(54) VOLTAGE BOOSTER WITH INCREASED VOLTAGE BOOST USING TWO PUMPING CAPACITORS

(75) Inventor: Anthony Yap Wong, Cupertino, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 10/249,282

(22) Filed: Mar. 27, 2003

(51) Int. Cl.[7] .............................................. H03K 17/16
(52) U.S. Cl. ......................... 327/390; 327/536; 363/60
(58) Field of Search ................. 827/108, 112, 827/389, 390, 306, 536; 363/59, 60

(56) References Cited

U.S. PATENT DOCUMENTS

| | | | |
|---|---|---|---|
| 3,639,696 A | 2/1972 | Chambers et al. | 379/401 |
| 5,361,237 A | 11/1994 | Chishiki | 365/230.06 |
| 5,412,604 A | 5/1995 | Fukuda et al. | 365/189.11 |
| 5,592,115 A | 1/1997 | Kassapian | 327/239 |
| 5,675,279 A | 10/1997 | Fujimoto et al. | 327/536 |
| 5,847,946 A * | 12/1998 | Wong | 363/60 |
| 5,889,427 A | 3/1999 | Nakajima | 327/536 |
| 5,946,204 A * | 8/1999 | Wong | 363/60 |
| 5,982,224 A | 11/1999 | Chung et al. | 327/536 |
| 6,069,828 A | 5/2000 | Kaneko et al. | 365/189.09 |
| 6,127,875 A | 10/2000 | Allen et al. | 327/306 |
| 6,157,225 A * | 12/2000 | Micheloni et al. | 327/112 |
| 6,157,242 A | 12/2000 | Fukui | 327/536 |

* cited by examiner

Primary Examiner—Long Nguyen
(74) Attorney, Agent, or Firm—Stuart T. Auvinen (57) ABSTRACT

A voltage booster drives the gate of a bus-switch n-channel transistor to a theoretical maximum of triple the power-supply voltage Vcc. The gate node is first driven to Vcc. Then the back-side of a first capacitor is driven from ground to Vcc, coupling a first voltage boost to the gate node. After a Schmidt-trigger detects the back-side of the first capacitor near Vcc, the back-side of a second capacitor is driven from ground to Vcc. The front-side of the second capacitor is connected to the back-side of the first capacitor. A second voltage boost is coupled across the first and second capacitors to increase the voltage boost of the gate node to near triple Vcc rather than just double Vcc.

20 Claims, 5 Drawing Sheets

VOLTAGE BOOSTER WITH INCREASED VOLTAGE BOOST USING TWO PUMPING CAPACITORS

BACKGROUND OF THE INVENTION

This invention relates to CMOS integrated circuits, and more particularly to voltage booster circuits.

Bus switches manufactured with semiconductor technology are used for high-speed network routing and switching applications. Complementary metal-oxide-semiconductor (CMOS) transistors may be used for bus switches, but using just an n-channel transistor without a parallel p-channel transistor reduces gate capacitance. The bus switch can connect or isolate two networks attached to the sources and drains of the transistors.

A bus-switch resistance of only 4 to 6 ohms between the networks is desirable. One solution is to boost the gate voltage to the n-channel transistor that acts as a bus switch. The gate voltage can be boosted above the power supply by a voltage-booster circuit. For example, the gate voltage can be boosted to 4.3 volts using a capacitive pump with a 3-volt power supply. See for example, U.S. Pat. No. 5,946,204 by Wong et al., assigned Pericom Semiconductor Corp. of San Jose, Calif.

Figure 1:
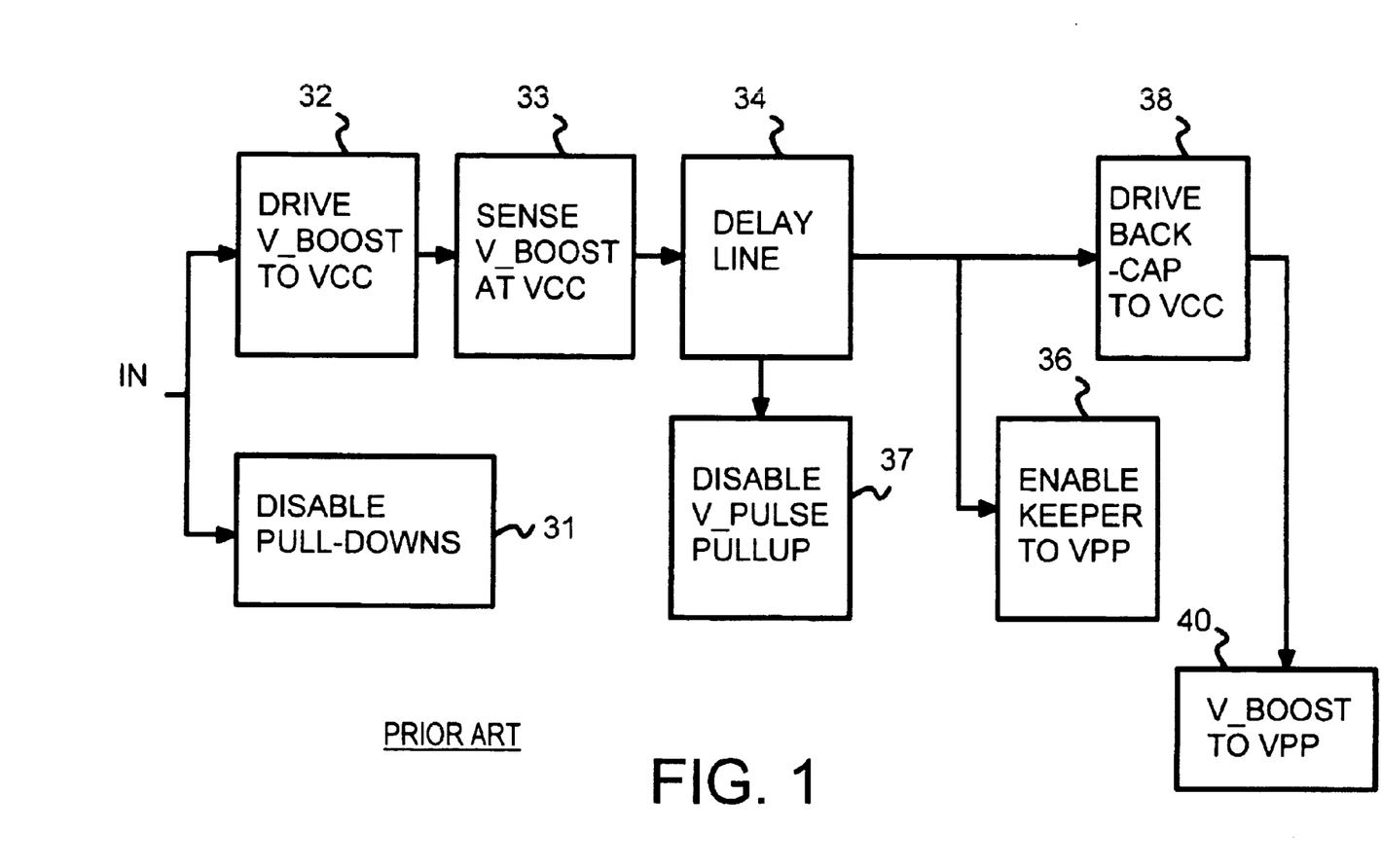
FIG. 1 is a diagram of a sequence of events when boosting the gate voltage above Vcc for the circuit of FIG.

Sequence of Events During Boosting FIG. 1

Figure 2:
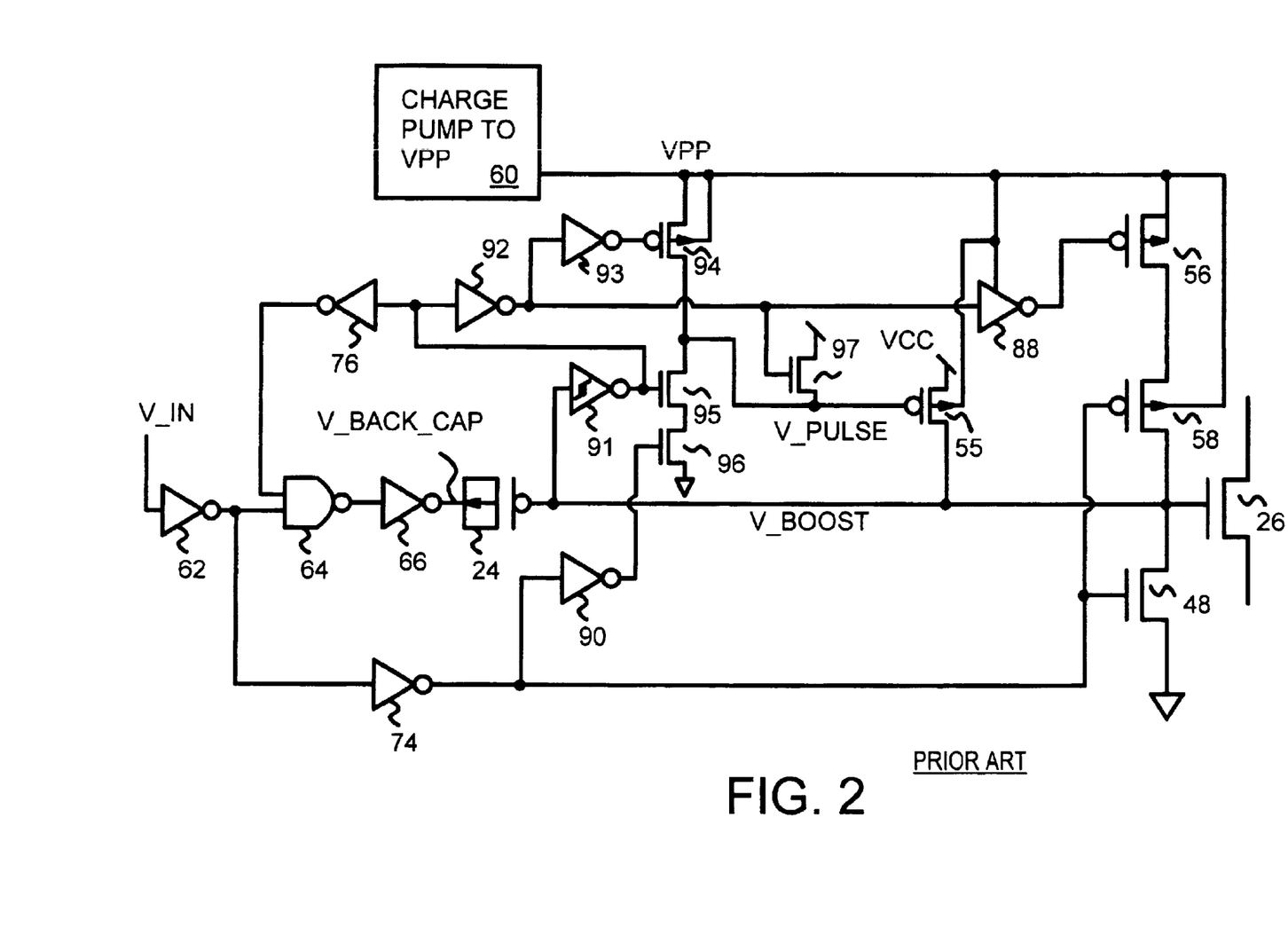
FIG. 2 is a schematic diagram of a prior-art voltage booster.

FIG. 1 is a diagram of a sequence of events when boosting the gate voltage above Vcc for the circuit of FIG. 2. The input signal disables the pull-down of the boosted node, step 31. Rather than generate a pulse, the boosted node (V_BOOST) is driven to Vcc, step 32.

A Schmidt-trigger inverter senses when the boosted node reaches Vcc, or a voltage slightly below Vcc, step 33. After a delay through a delay line, step 34, the gate of the transistor pulling V_PULSE up to Vcc is then disabled, step 37. The delay line also drives the back-side of the capacitor from ground to Vcc, step 38. This voltage swing is capacitivly coupled through the capacitor to the boosted node, step 40. The voltage on the boosted node is boosted up to about Vpp, depending on the capacitive coupling ratio.

A small keeper pull-up is enabled, step 36. This keeper device is not large enough to pull the boosted node to the charge-pump voltage Vpp, but is large enough to compensate for small leakage currents from the boosted node.

This sequence of events first drives the boosted gate node to Vcc, and then after a delay the boosted node is driven to Vpp by capacitive coupling. Enabling and disabling of keeper and pull-down devices are precisely coordinated to maximize the voltage boost.

Voltage Booster Circuit FIG. 2

FIG. 2 is a schematic diagram of a prior-art voltage booster. When V_IN is high, the boosted node (V_BOOST) is grounded so bus-switch transistor 26 is turned off. The back-side node (V_BACK_CAP) is also grounded, so that both sides of capacitor 24 are grounded. Transistors 55, 56, and 58 are off, disabling all pull-up current paths. The boosted node is pulled down to ground by pull-down n-channel transistor 48 when V_IN is high.

P-channel transistor 55 is a non-series-connected pull-up used to initially drive the boosted node to Vcc. The gate of p-channel transistor 55, V_PULSE, is initially high but is driven low through n-channel transistors 95, 96 when the input V_IN goes low. Inverter 90 drives high the gate of n-channel transistor 96 while n-channel transistor 95 is already on since it is driven high by Schmidt-trigger inverter 91 which senses the initial low voltage on V_BOOST.

Once p-channel transistor 55 drives V_BOOST to near Vcc, Schmidt-trigger inverter 91 switches its output low, disabling n-channel transistor 95. Inverter 92 turns on n-channel pullup transistor 97, which pulls V_PULSE up to Vcc–Vtn. Then inverter 93 enables p-channel transistor 94 to drive V_PULSE all the way up to Vpp, completely shutting off p-channel transistor 55.

Charge pump 60 drives the sources to Vpp of a p-channel pull-up transistor within inverter 88 in the delay line. The delay line has its input connected to the boosted node by Schmidt-trigger inverter 91, and includes inverters 92, 93 driving p-channel transistor 94 and inverter 76 that drives the back-side of capacitor 24 from ground to Vcc after the delay through the delay line. Inverters 76, 92, 93 and Schmidt-trigger inverter 91 are not connected to Vpp to reduce current drawn from Vpp. Thus only part of the delay line, inverter 88, is charge-pumped.

P-channel transistors 56, 58 act as small keeper transistors to compensate for any leakage currents in the boosted node. The source and N-well terminals of p-channel keeper transistor 56 are connected to Vpp from charge pump 60. The N-well substrates of transistors 55, 58 are connected to Vpp so that the p+-to-substrate diodes at the sources of these transistors do not become forward biased and conduct current from the boosted node.

P-channel transistors turn on when their gates are at least a p-channel threshold below their sources. If Vpp is more than a threshold above Vcc, and is applied to the source of transistors 56, then the transistor could turn on when the gate is driven to Vcc when it should be off. Sub-threshold currents can also be a problem even if the gate-to-source voltage is somewhat less than a threshold. To avoid these problems, the gate of transistor 56 is driven high to Vpp rather than to Vcc, so that the gate-to-source voltage is zero when the transistor is intended to be off. Inverter 88 in the delay line are thus connected to Vpp rather than Vcc so that it drives the gates of transistor 56 high to Vpp. The substrates of transistors 94, 55 are also connected to Vpp.

Capacitor 24 is constructed from a p-channel transistor with its source, drain, and substrate (bulk) terminals connected together as the back-side node of capacitor 24, while the transistor's gate is the front-side node, the boosted node. Using the gate of capacitor 24 for the boosted node reduces leakage and parasitic capacitances. A p-channel transistor is used to construct capacitor 24 so that it can have its own N-well; n-channel transistors share a common p-type substrate.

While such a voltage-booster circuit is useful for driving the gate of a bus-switch transistor, reduced power supplies have reduced the boost provided by such a circuit. Since the voltage boost is to about double Vcc, when Vcc is reduced, the absolute voltage boosted to is also reduced. It is therefore desirable to provide a larger voltage boost. A boost circuit that can boost to a larger multiple of the Vcc power supply is desirable for low-voltage applications.

DETAILED DESCRIPTION

The present invention relates to an improvement in voltage boosters. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

A double booster circuit can boost voltage theoretically up to three times its power supply value, which is one third higher than the prior art boost. This high voltage boost is applied to the gate of the n-channel bus-switch transistor to increase the channel transconductance and reduce the channel resistance. Channel capacitance can be reduced since a smaller transistor size can be used for a desired channel ON resistance when a boosted gate voltage is applied. Channel capacitances of 6 to 9 pico-Farads are desirable.

Figure 3:
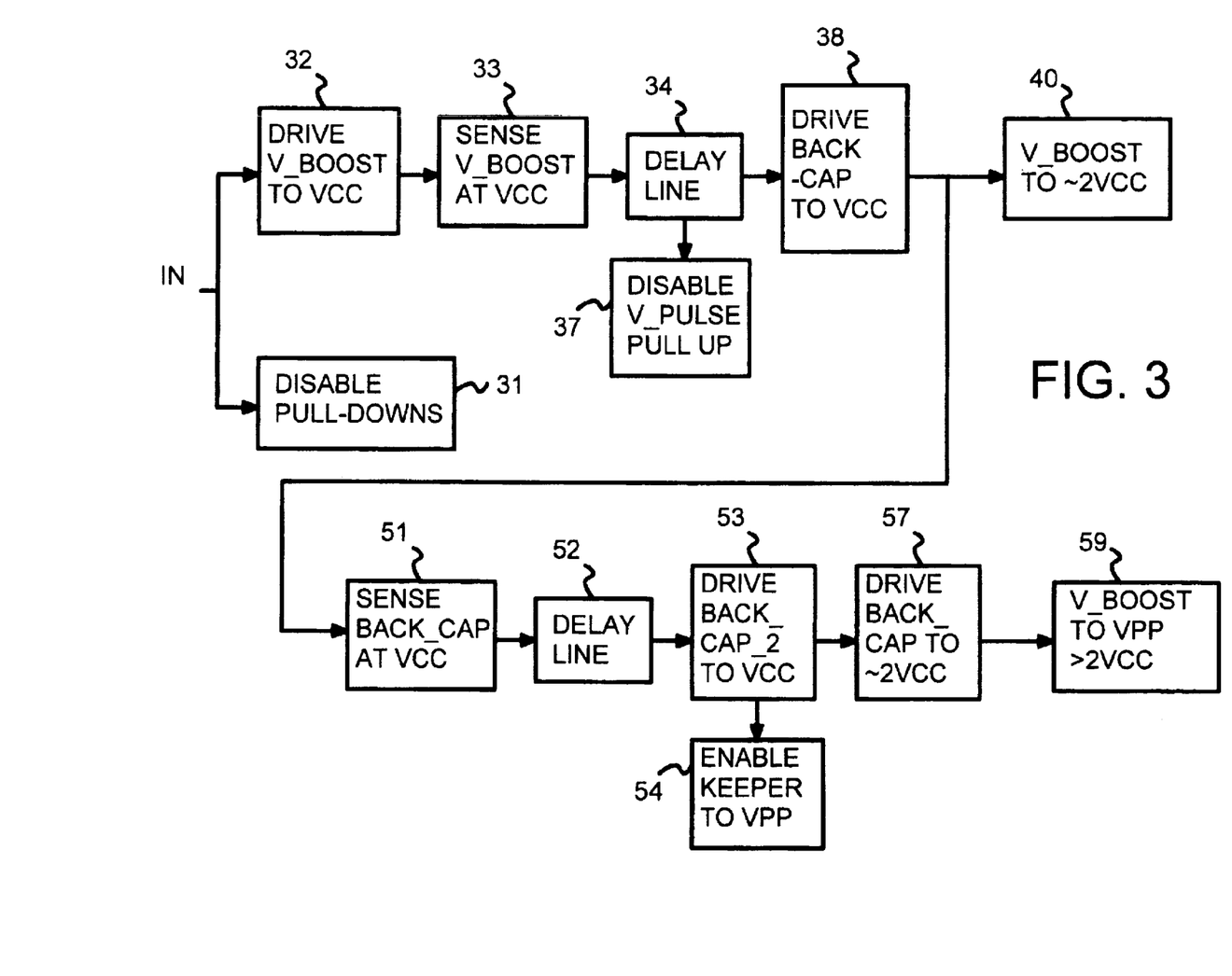
FIG. 3 is a diagram of an improved sequence of events when boosting the gate voltage to about three times Vcc.

FIG. 3 is a diagram of an improved sequence of events when boosting the gate voltage to about three times Vcc. The input signal disables the pull-down of the boosted node, step 31. The boosted node (V_BOOST) is driven to Vcc, step 32.

A first Schmidt-trigger inverter senses when the boosted node reaches Vcc, or a voltage slightly below Vcc, step 33. After a delay through a first delay line, step 34, the gate of the transistor pulling V_PULSE up to Vcc is then disabled, step 37. The delay line also drives the back-side of the first capacitor (node V_BACK_CAP) from ground to Vcc, step 38. This voltage swing is capacitivly coupled through the capacitor to the boosted node, step 40. The voltage on the boosted node is initially boosted up to about double Vcc, depending on the capacitive coupling ratio, step 40.

A second boosting sequence boosts V_BOOST from 2xVcc to 3xVcc. A second Schmidt-trigger inverter senses when the back-side of the first capacitor (node V_BACK_CAP) reaches Vcc, or a voltage slightly below Vcc, step 51. After a delay through a second delay line, step 52, the back-side of the second capacitor (node V_BACK_CAP2) is driven from ground to Vcc, step 53. This voltage swing is capacitivly coupled through the second capacitor to the back-side of the first capacitor (node V_BACK_CAP), step 57. Since the back-side of the first capacitor (node V_BACK_CAP) is already at Vcc, it is boosted up from Vcc to double Vcc. As the back-side of the first capacitor (node V_BACK_CAP) is boosted from Vcc to 2xVcc, the other side of the first capacitor, node V_BOOST, is boosted up another Vcc, from 2xVcc to 3xVcc, step 59.

The voltage boosts depend on the capacitive coupling ratio, so that 3x and 3xVcc are theoretical boosts. Actual boosts are lower.

The second delay line also activates a small keeper pull-up, step 54. This keeper device is not large enough to pull the boosted node V_BOOST to the charge-pump voltage Vpp, but is large enough to compensate for small leakage currents from the boosted node. Vpp can be set to be about triple Vcc rather than just double Vcc.

This sequence of events first drives the boosted gate node to Vcc, and then after a delay the boosted node is driven to 2xVcc and then to 3xVcc by capacitive coupling. Enabling and disabling of keeper and pull-down devices are precisely coordinated to maximize the voltage boost.

Figure 4:
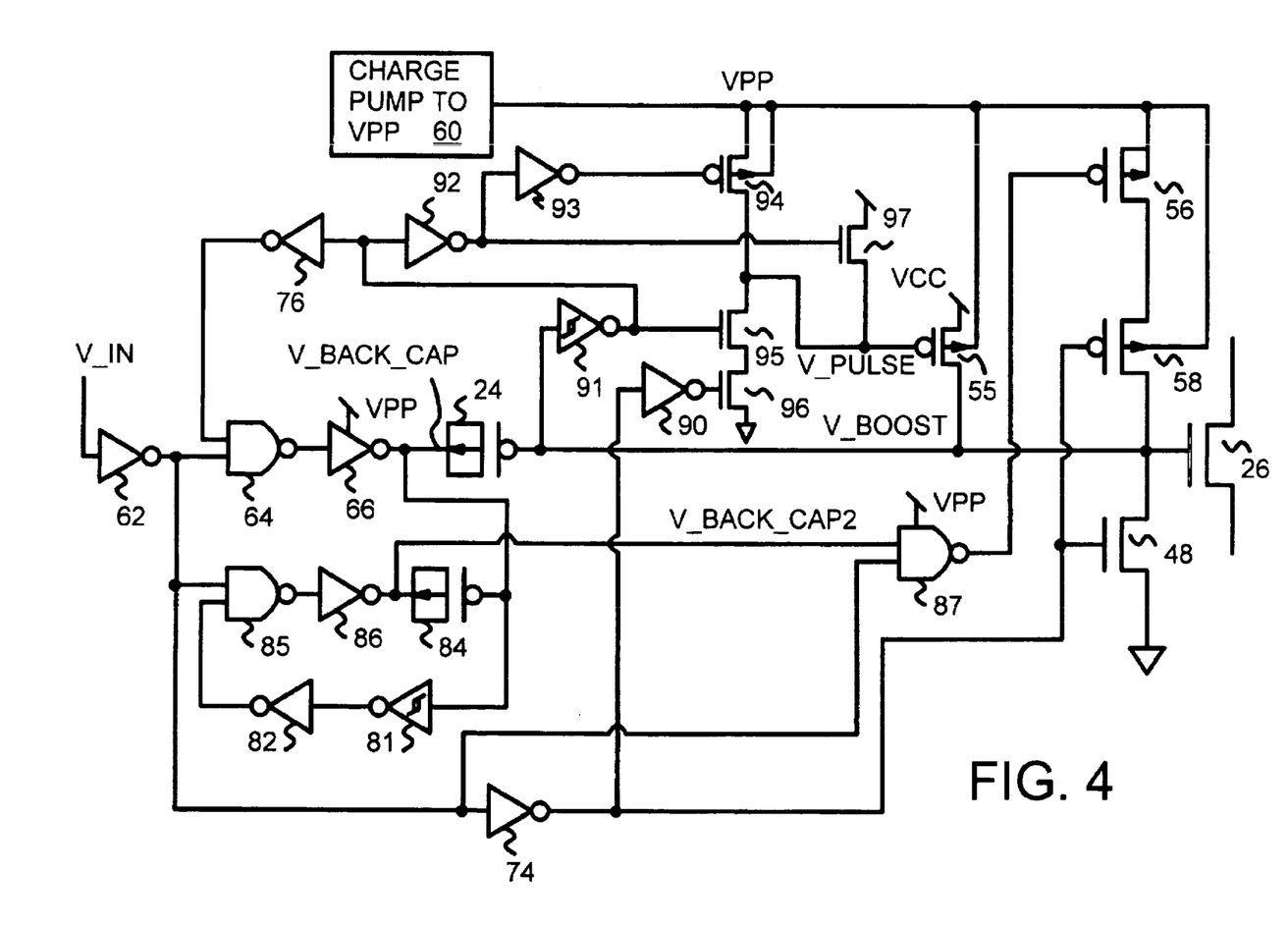
FIG. 4 is a schematic diagram of an improved voltage booster circuit that can boost to triple Vcc.

Detailed Double-Booster Circuit FIG. 4

FIG. 4 is a schematic diagram of an improved voltage booster circuit that can boost to triple Vcc. When V_IN is high, the boosted node (V_BOOST) is grounded so bus-switch transistor 26 is turned off. The first back-side node (V_BACK_CAP) is also grounded, so that both sides of first capacitor 24 are grounded. Likewise, the second back-side node (V_BACK_CAP2) is also grounded, so that both sides of second capacitor 84 are grounded. Transistors 55, 56, and 58 are off, disabling all pull-up current paths. The boosted node V_BOOST is pulled down to ground by pull-down n-channel transistor 48 when V_IN is high.

P-channel transistor 55 is a non-series-connected pull-up used to initially drive the boosted node to Vcc. The gate of p-channel transistor 55, V_PULSE, is initially high but is driven low through n-channel transistors 95, 96 when the input V_IN goes low. Inverter 90 drives high the gate of n-channel transistor 96 while n-channel transistor 95 is already on since it is driven high by Schmidt-trigger inverter 91, which senses the initial low voltage on V_BOOST.

Once p-channel transistor 55 drives V_BOOST to near Vcc, Schmidt-trigger inverter 91 switches its output low, disabling n-channel transistor 95. Inverter 92 turns on n-channel pullup transistor 97, which pulls V_PULSE up to Vcc–Vtn. Then inverter 93 enables p-channel transistor 94 to drive V_PULSE all the way up to Vpp, completely shutting off p-channel transistor 55.

Charge pump 60 generates a Vpp voltage of about triple Vcc. Charge pump 60 drives the sources to Vpp of p-channel pull-up transistors within NAND gate 87 in the second delay line. The second delay line has its input connected to the first backside node V_BACK_CAP by Schmidt-trigger inverter 81, and includes inverters 82, NAND gate 85, and inverter 86 that drives the back-side of second capacitor 84 from ground to Vcc after the delay through the second delay line. Inverters 82, 86 and Schmidt-trigger inverter 81 are not connected to Vpp to reduce current drawn from Vpp. Thus only part of the second delay line, NAND gate 87, is charge-pumped.

Charge pump 60 also drives to Vpp the gate and N-well of a p-channel pull-up transistor in inverter 66 in the first delay line. The first delay line has its input connected to the boosted node by Schmidt-trigger inverter 91, and includes inverters 92, 93 driving p-channel transistor 94 and inverter 76 that drives the back-side of first capacitor 24 from ground to Vcc after the delay through the delay line. Inverters 76, 92, 93 and Schmidt-trigger inverter 91 are not connected to Vpp to reduce current drawn from Vpp. Thus only part of the first delay line, inverter 66, uses a charge-pumped gate and N-well for its p-channel transistor.

P-channel transistors 56, 58 act as small keeper transistors to compensate for any leakage currents in the boosted node. The source and N-well terminals of p-channel keeper transistor 56 are connected to Vpp from charge pump 60. The N-well substrates of transistors 55, 58 are connected to Vpp so that the p+-to-substrate diodes at the sources of these transistors do not become forward biased and conduct current from the boosted node.

P-channel transistors turn on when their gates are at least a p-channel threshold below their sources. If Vpp is more than a threshold above Vcc, and is applied to the source of transistors 56, then the transistor could turn on when the gate is driven to Vcc when it should be off. Sub-threshold currents can also be a problem even if the gate-to-source voltage is somewhat less than a threshold. To avoid these problems, the gate of transistor 56 is driven high to Vpp rather than to Vcc, so that the gate-to-source voltage is zero when the transistor is intended to be off. NAND gate 87 in the second delay line is connected to Vpp rather than to Vcc so that it drives the gate of transistor 56 high to Vpp. The substrates of transistors 94, 55 are also connected to Vpp. Also, a p-channel transistor in inverter 66 in the first delay line has its n-well and gate connected to Vpp rather than Vcc so that it drives the first back-side node V_BACK_CAP to Vcc, but with a 2×Vcc tolerance, since first back-side node V_BACK_CAP is driven to double Vcc by coupling through second capacitor 84.

First capacitor 24 is constructed from a p-channel transistor with its source, drain, and substrate (bulk) terminals connected together as the back-side node of capacitor 24, while the transistor's gate is the front-side node, the boosted node. Second capacitor 84 is also constructed from a p-channel transistor with its source, drain, and substrate (bulk) terminals connected together as the back-side node of capacitor 84, while the transistor's gate is a boosted node. Using gates of capacitors 24, 84 for boosted nodes reduces leakage and parasitic capacitances. A p-channel transistor is used to construct capacitors 24, 84 so that each can have its own N-well; n-channel transistors share a common p-type substrate.

Operation

Initially, when V_IN is high and the bus switch is disabled, isolating the source and drain of bus-switch transistor 26, transistors 55, 56, 58, 96, and 97 are off while transistors 48, 94 and 95 are on. V_BOOST and V_BACK_CAP are at ground while V_PULSE is at Vpp.

When V_IN is asserted low to enable bus-switch transistor 26, a sequence of events is initiated as shown in FIG. 3. The low transition of V_IN is transmitted through inverters 62, 74 to disable pull-down n-channel transistor 48 and enable p-channel transistor 58. P-channel transistors 56, 58 are in series, but current does not yet flow since keeper p-channel transistor 56 is still off.

The back-side of first capacitor 24 remains at ground even when the bottom input to NAND gate 64 transitions high, because inverter 76 still drives a low to the upper input to NAND gate 64. Likewise, The back-side of second capacitor 84 remains at ground even when the top input to NAND gate 85 transitions high, because inverter 82 still drives a low to the lower input to NAND gate 85.

Inverter 90 drives high the gate of n-channel transistor 96. Since n-channel transistor 95 is still on, since V_BOOST is low, V_PULSE is discharged to ground through n-channel transistors 95, 96. Once V_PULSE is discharged, the gate of p-channel transistor 55 is low and transistor 55 turns on. The boosted node is driven high from ground to Vcc through p-channel transistor 55. P-channel pulse transistor 55 continues to pull the boosted node up to Vcc.

Once the boosted node is pulled from ground up to Vcc by transistor 55, the first delay line is activated. Schmidt-trigger inverter 91 has its input connected directly to the boosted node. Schmidt-trigger inverter 91 has a high logic threshold and switches as V_BOOST nears Vcc. Once Schmidt-trigger inverter 91 switches, a low is driven to the gate of n-channel transistor 95, isolating V_PULSE from ground.

Inverter 92 then drives a high to the gate of n-channel pullup transistor 97.

V_PULSE is pulled up to Vcc–Vtn, one transistor threshold below Vcc. After a delay through inverter 93, the gate of p-channel transistor 94 is driven low, and p-channel transistor 94 drives V_PULSE up beyond Vcc–Vtn to Vpp. Since Vpp is greater than Vcc, p-channel transistor 55 is shut off.

Inverter 76 then drives a high to the upper input of NAND gate 64, and inverter 66 drives the back-side (V_BACK_CAP) of first capacitor 24 high, from ground to Vcc. Inverter 66 can be made large and fast to quickly drive the back-side of capacitor 24. Part of this voltage swing is coupled to the front-side of first capacitor 24, resulting in a boost in the voltage of the boosted node V_BOOST. The voltage is boosted from Vcc (about 3 volts) to about 5 volts. Once the first back-side node V_BACK_CAP is pulled from ground up to Vcc by inverter 66, the second delay line is activated. Schmidt-trigger inverter 81 has its input connected directly to the first back-side node V_BACK_CAP. Schmidt-trigger inverter 81 has a high logic threshold and switches as V_BACK_CAP nears Vcc.

Inverter 82 then drives a high to the lower input of NAND gate 85, and inverter 86 drives the back-side (V_BACK_CAP2) of second capacitor 84 high, from ground to Vcc. Inverter 86 can be made large and fast to quickly drive the back-side of capacitor 84. Part of this voltage swing is coupled to the front-side of second capacitor 84, boosting still further the first back-side node (V_BACK_CAP) above Vcc toward double Vcc. Some of this voltage swing is again coupled across first capacitor 24 to boosted node V_BOOST. This additional coupling results in a second boost in the voltage of the boosted node V_BOOST. The voltage is boosted from double Vcc to near triple Vcc, about 7.5 volts for a 3-volt Power supply.

This double-boosted voltage is applied to the gate of bus-switch transistor 26, increasing the gate-to-source voltage and thus increasing its current drive and reducing its channel resistance. A faster and smaller bus switch is thus achieved.

The second back-side node at Vcc is applied to the upper input of NAND gate 87, causing NAND gate 87 to output a low voltage to keeper p-channel transistor 56, which then supplies a very small current from Vpp to the boosted node through transistor 58, which is also on. The size of keeper p-channel transistors 56, 58 are small so that little current is drawn from charge pump 60. These transistors are not large enough to actively drive the boosted node to Vpp, which requires tens of milliamps of current. Instead, only a few microamps of current are supplied, reducing the drain on charge pump 60.

The voltage boost coupled through capacitors 24, 84 is determined by the coupling ratio, a ratio of the capacitance of first capacitor 24 to the total capacitance of the boosted node, or a ratio of the capacitance of second capacitor 84 to the total capacitance of node V_BACK_CAP. The gate capacitance of transistor 26 is significant, while the input capacitance to the delay line and the drain capacitances of pull-down transistor 48, pull-up transistor 55, and keeper 58 are smaller. A coupling ratio of 0.3 to 0.5 can be achieved by making capacitor 24 large and minimizing other capacitances on the boosted node. Such a coupling ratio coupes 1.5 to 1.7 volts of the 3-volt swing into the boosted node. Thus the voltage V_BOOST on the gate of transistor 26 is boosted to about 4.5 to 5.0 volts when capacitor 24 is large.

Figure 5:
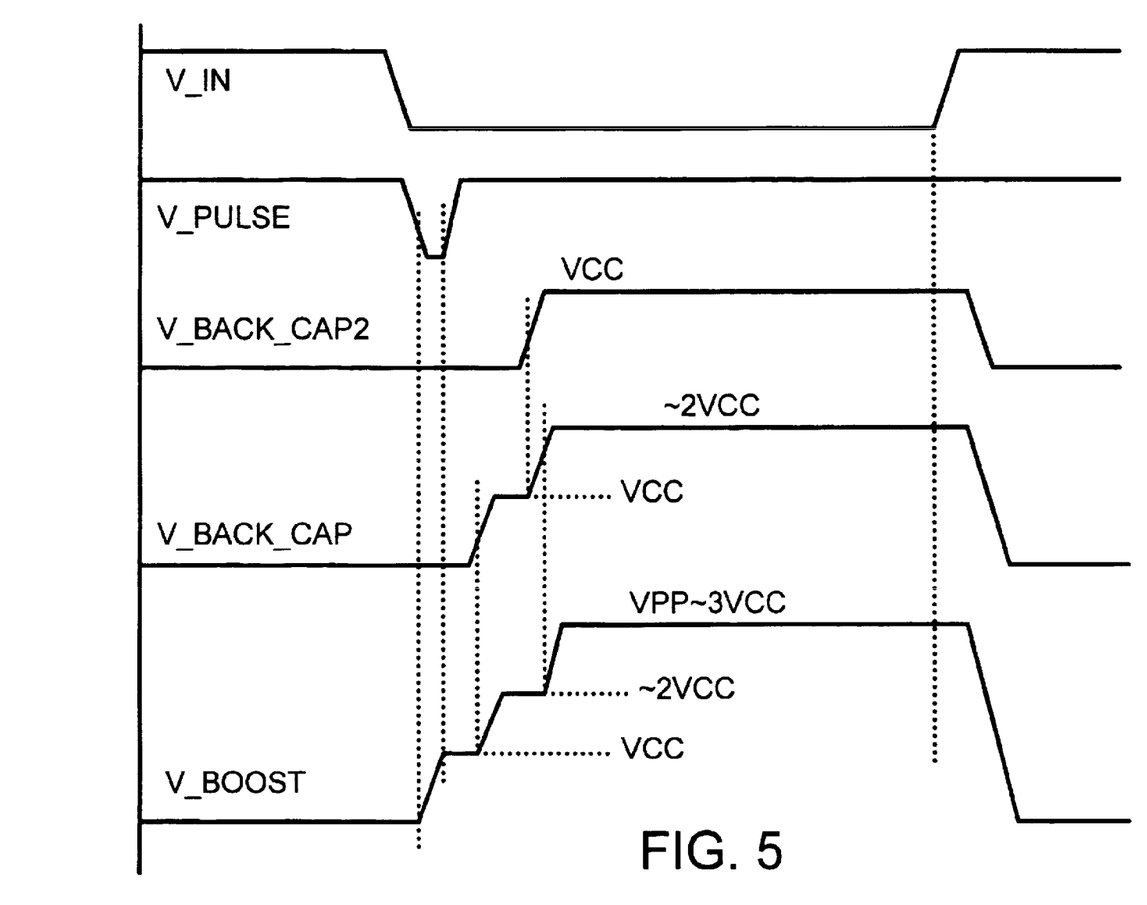
FIG. 5 is a waveform diagram of the operation of the voltage booster circuit.

Waveform FIG. 5

FIG. 5 is a waveform diagram of the operation of the voltage booster circuit.

When the input voltage V_IN is driven low to enable the bus switch, V_PULSE is driven low to enable a pull-up that drives the boosted node's voltage V_BOOST from ground to the power-supply voltage Vcc. The width of the pulse is determined, not by a pulse generator, but by a feedback control loop. The feedback is triggered by a Schmidt-trigger inverter that senses when the voltage of V_BOOST nears Vcc. This feedback control loop is what turns off the pullup driving V_BOOST to Vcc. Thus the pulse is sufficient to drive the boosted node all the way up to Vcc.

Once V_BOOST is sensed to be near Vcc, and after a delay through the first delay line, the back-side of the first capacitor is driven from ground to Vcc. Only a fraction of the swing of V_BACK_CAP is coupled to the boosted node on the front-side of the capacitor, but this fraction is sufficient to boost voltage V_BOOST from Vcc to about double Vcc.

Then when V_BACK_CAP is sensed to be near Vcc, and after a delay through the second delay line, the back-side of the second capacitor V_BACK_CAP2 is driven from ground to Vcc. The back-side of the first capacitor is boosted further, from Vcc to near double Vcc. Only a fraction of the swing of V_BACK_CAP2 is coupled to the back-side of the first capacitor, V_BACK_CAP, and further coupled to the boosted node on the front-side of the first capacitor, but this fraction is sufficient to boost voltage V_BOOST from double Vcc to about triple Vcc.

When input voltage V_IN is driven high to disable the bus switch, the boosted node is driven low by a pull-down transistor and the pull-ups are disabled. The back-sides of the capacitors are also driven to ground to make them ready for a full swing up to Vcc the next time the bus switch is enabled.

ALTERNATE EMBODIMENTS

Several other embodiments are contemplated by the inventor. For example circuit devices can be substituted for the delay line, perhaps including resistive or capacitive delay elements. Transistor device sizes can be adjusted. Buffers and inversions can be added or removed. N-channel transistors and p-channel transistors can be stacked respectively. The Schmidt-trigger inverter can be implemented in a variety of well-known ways in CMOS technology, and its input threshold can be kept higher for rising inputs than for falling inputs. The exact input threshold can vary, but the rising-input and falling-input thresholds are asymmetric for Schmidt-triggers.

The term V_PULSE has been used for the control signal applied to the gate of the p-channel transistor that pulls the boosted node from ground to Vcc. This term was used for a similar control node in the parent application that was driven by a pulse generator. The improved boost circuit has no pulse generator and thus the term V_PULSE is not precise. However, using the same term for the same control node in both the original and improved booster circuits is useful for understanding the invention.

Additional levels of boosting could be added to boost to four, five, or more times Vcc. The Vpp voltage can be adjusted to match the target boost voltage, or Vpp can be some other elevated voltage that does not exactly match the boost voltage. Some conduction through keeper transistors could then occur. When a voltage is "near" the Vcc power supply, the voltage is above the switching threshold of the Schmidt trigger inverter, which is often about $2/3$ of Vcc. A leakage current of a few microamps is a leakage current that is less than ten microamps.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A double-boost voltage booster comprising:
    a buffer for buffering an input signal to generate a buffered input signal;
    a charge pump for generating a pumped voltage above a power-supply voltage;
    a boosted node driven from ground to a boosted voltage above the power-supply voltage;
    a pull-down n-channel transistor, coupled to drive the boosted node to ground in response to the buffered input signal;
    a pull-up p-channel transistor, having a gate controlled by the buffered input signal, for coupling the boosted node to a keeper node;
    a keeper p-channel transistor, coupled to supply a keeper current to the keeper node from the charge pump, the keeper p-channel transistor having a keeper gate;
    a control node, initially driven low in response to the buffered input signal;
    a first p-channel transistor, having a drain coupled to the boosted node and a source coupled to a power source providing the power-supply voltage, for conducting current from the power source to the boosted node in response to the control node applied to a gate of the first p-channel transistor;
    a second p-channel transistor, having a drain coupled to the control node and a source coupled to the pumped voltage from the charge pump, for conducting current from the pumped voltage to the control node, the second p-channel transistor having a gate controlled by a delayed node;
    a first delay line, having a first inverter with an input connected to the boosted node, for delaying a rising transition of the boosted node to drive the delayed node to control the second p-channel transistor and for driving a first back-side node;

a first capacitor, coupled between the first back-side node and the boosted node, for coupling a first voltage swing output by the first delay line to the boosted node;

a second delay line, having a second inverter with an input connected to the first back-side node, for delaying a rising transition of the first back-side node to drive a second back-side node; and a second capacitor, coupled between the first back-side node and the second back-side node, for coupling a second voltage swing output by the second delay line to the first back-side node, whereby the first voltage swing is coupled to the boosted node through the first capacitor and the second voltage swing is coupled to the boosted node through the first and second capacitors.

2. The double-boost voltage booster of claim 1 wherein the boosted node is driven toward a theoretical maximum of three times the power-supply voltage.

3. The double-boost voltage booster of claim 1 wherein the first inverter in the first delay line comprises a first Schmidt-trigger inverter and wherein the second inverter in the second delay line comprises a second Schmidt-trigger inverter.

4. The double-boost voltage booster of claim 3 wherein the first Schmidt-trigger inverter has a high input threshold, an output of the first Schmidt-trigger inverter being driven low once the boosted node nears the power-supply voltage, and wherein the second Schmidt-trigger inverter has a high input threshold, an output of the second Schmidt-trigger inverter being driven low once the first back-side node nears the power-supply voltage.

5. The double-boost voltage booster of claim 4 wherein a leakage current is drawn from the charge pump by the double-boost voltage booster, the leakage current being a few microamps.

6. The double-boost voltage booster of claim 5 wherein the first capacitor is a p-channel transistor with a gate connected to the boosted node and a source and a drain connected together to the first back-side node, and wherein the second capacitor is a p-channel transistor with a gate connected to the first back-side node and a source and a drain connected together to a second back-side node.

7. The double-boost voltage booster of claim 6 further comprising:

an n-channel pullup transistor, having a gate controlled by the first delay line, for driving the control node to a threshold voltage below the power-supply voltage, the n-channel pullup transistor being activated by the first delay line before the second p-channel transistor is activated, whereby the control node is first pulled high by the n-channel pullup transistor and then pulled to the pumped voltage by the second p-channel transistor.

8. The double-boost voltage booster of claim 7 further comprising:

a first control pull-down transistor, having a gate controlled by the buffered input signal, for pulling the control node down to ground;

a second control pull-down transistor, coupled in series with the first control pull-down transistor, having a gate controlled by the first inverter in the first delay line, for isolating the control node from ground;

wherein the first control pull-down transistor and the second control pull-down transistor are n-channel transistors.

9. The double-boost voltage booster of claim 8 wherein the boosted node is coupled to a gate of a bus-switch transistor, the bus-switch transistor having a lower on-resistance when the boosted node is at the boosted voltage than at the power-supply voltage.

10. The double-boost voltage booster of claim 9 further comprising:

a logic gate having an input connected to the buffered input signal and another input coupled to the second back-side node, for driving the keeper gate of the keeper p-channel transistor;

wherein the logic gate is connected to the pumped voltage from the charge pump and not connected to the power-supply voltage, whereby the logic gate outputs the pumped voltage rather than the power-supply voltage.

11. The double-boost voltage booster of claim 10 wherein the logic gate is a NAND gate.

12. The double-boost voltage booster of claim 9 wherein the first delay line has a final inverter for driving the first back-side node;

wherein the final inverter is connected to the pumped voltage from the charge pump.

13. A voltage-boosted bus switch comprising:

an input signal for controlling when the voltage-boosted bus switch is to isolate and when the voltage-boosted bus switch is to connect a first node and a second node;

a bus-switch transistor, coupled between the first node and the second node, the bus-switch transistor conducting current between the first node and the second node in response to a boosted node coupled to a gate of the bus-switch transistor;

a first pullup transistor, coupled to drive the boosted node toward a power-supply voltage, the first pullup transistor having a gate connected to a control node;

control pulldown means for discharging the control node in response to the input signal;

first voltage sensor means, coupled to the boosted node, for sensing a voltage of the boosted node when the boosted node has been charged to near the power-supply voltage by the first pullup transistor;

control isolation means, coupled between the control pulldown means and the control node, for isolating the control node in response to the first voltage sensor means detecting that the boosted node is near the power-supply voltage;

control pullup means, responsive to the first voltage sensor means, for charging the control node and disabling the first pullup transistor when the first voltage sensor means detects that the boosted node is near the power-supply voltage;

first capacitor means, coupled between the boosted node and a first back node, for capacitively coupling a first voltage swing of the first back node into the boosted node when the first voltage sensor means detects that the boosted node is near the power-supply voltage;

second voltage sensor means, coupled to the first back node, for sensing a voltage of the first back node when the first back node has been charged to near the power-supply voltage; and second capacitor means, coupled between the first back node and a second back node, for capacitively coupling a second voltage swing of the second back node into the first back node when the second voltage sensor means detects that the first back node is near the power-supply voltage;

wherein the second voltage swing is further coupled to the boosted node by the first capacitor means, whereby the boosted node is boosted twice above the power-supply voltage.

14. The voltage-boosted bus switch of claim 13 wherein the first voltage sensor means comprises a first Schmidt-trigger inverter having a higher input threshold for rising input transitions than for falling input transitions and wherein the second voltage sensor means comprises a second Schmidt-trigger inverter having a higher input threshold for rising input transitions than for falling input transitions.

15. A double voltage booster circuit comprising:

an input signal;

a boosted node;

a control node, the control node initially driven low by a transition of the input signal;

a first pull-up, coupled to the boosted node, for pulling the boosted node to a power-supply voltage in response to the control node;

a first voltage sensor, coupled to the boosted node, for sensing a voltage of the boosted node when the boosted node is pulled up to near the power-supply voltage;

a first delay line, coupled to the first voltage sensor, for generating a delayed signal in response to the boosted node being pulled up toward the power-supply voltage, the first delay line also for generating another delay signal for driving the control node high after a delay;

a first capacitor, coupled to the boosted node and responsive to the delayed signal on a first back node, for capacitively coupling a first voltage swing of the first back node into the boosted node in response to the delayed signal, the first voltage swing boosting a voltage of the boosted node to a first boosted voltage above the power-supply voltage;

a second voltage sensor, coupled to the first back node, for sensing a voltage of the first back node when the first back node is driven to near the power-supply voltage;

a second delay line, coupled to the second voltage sensor, for generating a second delayed signal on a second back node in response to the first back node being pulled up toward the power-supply voltage; and a second capacitor, coupled to the first and second back nodes and responsive to the second delayed signal, for capacitively coupling a second voltage swing of the second back node into the first back node in response to the second delayed signal, the second voltage swing boosting a voltage of the first back node to a voltage above the power-supply voltage, the first capacitor then boosting the boosted node to a second boosted voltage above the power-supply voltage, the second boosted voltage being above the first boosted voltage, whereby the boosted node is boosted twice by capacitive coupling through the first and second capacitors.

16. The double voltage booster circuit of claim 15 further comprising:

a charge pump for generating a pumped voltage above the power-supply voltage.

17. The double voltage booster circuit of claim 16 further comprising:

a keeper pull-up device, coupled to the boosted node and coupled to the charge pump, for supplying a compensating current to the boosted node, the compensating current sufficient to offset leakage currents from the boosted node but not sufficient to pull the boosted node up to the pumped voltage.

18. The double voltage booster circuit of claim 17 wherein the keeper pull-up device is further coupled to the sec delayed signal from the second delay line, the keeper pull-up device being enabled by the second delayed signal.

19. The double voltage booster circuit of claim 18 further comprising:

a second pullup device, controlled by the first delay line, for driving the control node high after a delay when the first voltage sensor senses that the boosted node is near the power-supply voltage;

a control-node pulldown device, responsive to the transition on the input signal, for initially driving the control node low;

an isolation transistor, coupled between the control-node pulldown device and the control node, for isolating the control-node pulldown device from the control node once the first voltage sensor senses that the boosted node is near the power-supply voltage.

20. The double voltage booster circuit of claim 19 wherein the boosted node is coupled to a gate of a bus-switch transistor, the bus-switch transistor driving a greater current when the boosted node is at the second boosted voltage than at the power-supply voltage.

* * * * *